(12) United States Patent
Li et al.

(10) Patent No.: US 9,853,064 B2
(45) Date of Patent: Dec. 26, 2017

(54) MANUFACTURE METHOD OF VIA HOLE, MANUFACTURE METHOD OF DISPLAY PANEL, AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Tiansheng Li, Beijing (CN); Zhenyu Xie, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 290 days.

(21) Appl. No.: 14/386,634

(22) PCT Filed: Nov. 18, 2013

(86) PCT No.: PCT/CN2013/087330
§ 371 (c)(1),
(2) Date: Sep. 19, 2014

(87) PCT Pub. No.: WO2014/205983
PCT Pub. Date: Dec. 31, 2014

(65) Prior Publication Data
US 2016/0247834 A1 Aug. 25, 2016

(30) Foreign Application Priority Data

Jun. 27, 2013 (CN) .......................... 2013 1 0264196

(51) Int. Cl.
*H01L 29/82* (2006.01)
*H01L 27/12* (2006.01)
(Continued)

(52) U.S. Cl.
CPC ........ *H01L 27/1244* (2013.01); *G02F 1/1333* (2013.01); *G02F 1/136227* (2013.01);
(Continued)

(58) Field of Classification Search
CPC ............. H01L 27/1244; H01L 27/1262; H01L 27/124; H01L 27/1248; G02F 1/1333
See application file for complete search history.

(56) References Cited

U.S. PATENT DOCUMENTS 5,453,403 A * 9/1995 Meng ................ H01L 21/76804
257/E21.578
5,841,196 A * 11/1998 Gupta ............... H01L 21/76804
216/39
(Continued)

FOREIGN PATENT DOCUMENTS

CN 1873946 A 12/2006
CN 101071263 A 11/2007
(Continued)

OTHER PUBLICATIONS

Second Chinese Office Action Appln. No. 201310264196.0; dated Nov. 23, 2015.
(Continued)

*Primary Examiner* — Cuong Q Nguyen
*Assistant Examiner* — Nishath Yasmeen
(74) *Attorney, Agent, or Firm* — Ladas & Parry LLP; Loren K. Thompson (57) ABSTRACT

A manufacture method of a via hole for a display panel, a manufacture method of a display panel, and a display panel are provided. During forming the via hole, a top film layer in an area to be formed with a via hole over a circuit pattern is etched under a first etching condition according to a slope angle as required; and a remaining portion in the area to be formed with a via hole is etched under a second etching
(Continued)

condition according to a selection ratio as required, so as to form the via hole finally. A problem in one-step etching process that the slope angle and the selection ratio cannot be set flexibly is avoided.

2 Claims, 5 Drawing Sheets

(51) Int. Cl.
  *G02F 1/1333* (2006.01)
  *G02F 1/1362* (2006.01)
(52) U.S. Cl.
  CPC ........ *H01L 27/124* (2013.01); *H01L 27/1248* (2013.01); *H01L 27/1262* (2013.01)

(56) References Cited

U.S. PATENT DOCUMENTS

| | | | | |
|---|---|---|---|---|
| 6,160,272 | A * | 12/2000 | Arai | H01L 27/156 257/291 |
| 6,235,626 | B1 * | 5/2001 | Makino | H01L 21/28587 257/192 |
| 6,313,019 | B1 * | 11/2001 | Subramanian | H01L 21/28114 257/E21.205 |
| 2006/0145161 | A1 * | 7/2006 | Lee | G02F 1/13458 257/72 |
| 2007/0262936 | A1 | 11/2007 | Chang et al. | |
| 2010/0295051 | A1 * | 11/2010 | Choi | H01L 27/3244 257/59 |
| 2012/0168791 | A1 | 7/2012 | Zhou et al. | |

FOREIGN PATENT DOCUMENTS

| | | |
|---|---|---|
| CN | 101140882 A | 3/2008 |
| CN | 102540524 A | 7/2012 |
| CN | 103354206 A | 10/2013 |
| JP | 2000-182989 A | 6/2000 |

OTHER PUBLICATIONS

International Preliminary Report on Patentability Appln. No. PCT/CN2013/087330; dated Dec. 29, 2015.

Third Chinese Office Action dated Apr. 29, 2016; Appln. No. 201310264196.0.

Fourth Chinese Office Action dated Sep. 21, 2016; Appln. No. 201310264196.0.

First Chinese Office Action dated Jun. 3, 2015; Appln. No. 201310264196.0.

International Search Report Appln. No. PCT/CN2013/087330; dated Apr. 3, 2014.

* cited by examiner

MANUFACTURE METHOD OF VIA HOLE, MANUFACTURE METHOD OF DISPLAY PANEL, AND DISPLAY PANEL

TECHNICAL FIELD

Embodiments of the present invention relate to a manufacture method of a via hole, a manufacture method of a display panel, and a display panel.

BACKGROUND

Formation of via holes is one of the important processes during the manufacture of a display panel. Through the via holes, electrical connections between circuit patterns located in different layer levels can be established. For example, in one of typical structures for an array substrate, a gate insulating layer covers gate lines; metallic layers, such as active layer, data lines, source electrode and drain electrode are formed on the gate insulating layer and are covered with a passivation layer; a drain electrode via hole is formed in the passivation layer on the drain electrode, so as to connect a pixel electrode with the drain electrode through the drain electrode via hole; and a gate connection via hole and a data connection via hole are formed over the gate lines and the data lines, respectively, so as to expose the gate lines and the data lines to be connected with a driving line.

The drain electrode via hole and the data connection via hole are formed by etching the passivation layer; and the gate connection via hole is formed by etching the passivation layer and the gate insulating layer. In a conventional technology, the drain electrode via hole, the data connection via hole and the gate connection via hole are usually formed by a one-step etching process. However, different film layers usually have different etching rates, and a ratio between etching rates in different film layers is defined as a selection ratio. When etching the gate insulating layer to form a gate connection via hole after forming a drain electrode via hole and a data connection via hole by etching process, it is accompanied with an etching of the metallic layers that form the drain electrode and data lines. If a selection ratio is defined as an etching rate for the gate insulating layer/an etching rate for the metallic layer, the selection ratio is preferably as larger as possible so that the metallic layer is less impacted when etching the gate insulating layer upon etching off the passivation layer.

Moreover, at present, a liquid crystal display (LCD) panel with narrow bezel has become one of the important development trends. For a panel design of relatively narrow bezel, a precision level of original equipments has to be considered, and if the original equipments cannot meet the required precision level, the realizability of the process as utilized must be taken into account. A via hole with reduced size is just a direct optimizing process in developing a product with a narrow bezel, because given a certain line width, the smaller the via hole is, the more precise the wiring is. A smaller via hole requires a larger slope angle, which, however, needs a smaller selection ratio between the gate insulating layer and the metallic layer. Since the one-step etching process cannot flexibly set etching conditions according to the slope angle and the selection ratio as required due to its fixed etching conditions, it's difficult to meet both of the above criteria.

SUMMARY

Embodiments of the present invention provide a manufacture method of a via hole, a manufacture method of a display panel, and a display panel.

According to an aspect of the present invention, a manufacture method of via hole is provided, comprising: etching a top film layer in an area to be formed with a via hole over a circuit pattern under a first etching condition according to a slope angle as required such that a portion etched under the first etching condition is formed with a preset slope angle; and etching a remaining portion of the area to be formed with a via hole under a second etching condition according to a selection ratio as required, so as to form the via hole finally; wherein the portion that is etched under the second etching condition and the portion that is etched under the first etching condition are formed with different slope angles.

According to another aspect of the present invention, a manufacture method of a display panel is provided, comprising following steps: forming a metallic layer including a gate line circuit pattern and a gate circuit pattern; forming a gate insulating layer; forming an active layer.

Forming a metallic layer including a data line circuit pattern, a source electrode circuit pattern and a drain electrode circuit pattern; forming a passivation layer on a substrate formed with the above-mentioned layers.

The gate insulating layer is formed between the metallic layer including the gate line circuit pattern and the gate circuit pattern and the active layer as well as the metallic layer including the data line circuit pattern, the source electrode circuit pattern and the drain electrode circuit pattern.

Etching an area in the passivation layer corresponding to a drain electrode via hole, a gate connection via hole or a data connection hole to be formed under a first etching condition according to a slope angle in the passivation layer as required for forming the drain electrode via hole, the gate connection via hole or the data connection hole.

Etching a remaining portion under a second etching condition after the etching under the first etching condition, according to a selection ratio of etching rate corresponding to the gate insulating layer and the metallic layer including a data line circuit pattern, a source electrode circuit pattern and a drain electrode circuit pattern, or according to a selection ratio of etching rate corresponding to the gate insulating layer and the metallic layer including a gate line circuit pattern and a gate circuit pattern, so as to form the drain electrode via hole, the gate connection via hole and the data connection via hole.

Depositing and etching an electrode layer to realize electrical connections between corresponding circuit patterns.

According to yet another aspect of the present invention, a display panel is provided, comprising a circuit pattern layer, a film layer located on the circuit pattern layer, and a via hole formed in the film layer located on the circuit pattern layer for conducting circuit patterns; wherein the via hole is formed by utilizing the above-mentioned method.

In an example, the display panel comprises a circuit pattern and an insulating layer formed on a substrate. The circuit pattern comprises at least a first circuit pattern and a second circuit pattern which are formed in different layer levels. The insulating layer comprises at least a first insulating layer and a second insulating layer formed on the substrate in sequence. The first circuit pattern is formed beneath the first insulating layer, and the second circuit pattern is formed on the first insulating layer and beneath the second insulating layer. The display panel further comprises a first hole and a second hole, which are formed under a first etching condition according to a slope angle as required and under a second etching condition according to a selection ratio as required in different steps, respectively.

The first hole is located over the first circuit pattern, penetrating the first insulating layer and the second insulating layer.

The second via hole is located over the second circuit pattern, penetrating the second insulating layer.

A portion of the first via hole that is located in the second insulating layer.

A portion of the first via hole that is located in the second insulating layer, and a portion of the second via hole with a same hole depth in the second insulating layer after an etching under the first etching condition, have a same slope angle; and for the first via hole and the second via hole, a remaining portion after an etching under the second etching condition and a portion that is etched under the first etching condition have different slope angles.

BRIEF DESCRIPTION OF THE DRAWINGS

Embodiments of the present invention will be described in more detail below with reference to the accompanying drawings to enable those skilled in the art to understand the present invention more clearly, wherein.

DETAILED DESCRIPTION

In order to make objects, technical details and advantages of the embodiments of the invention apparent, technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor, and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," "the" or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

First Embodiment

Figure 1:
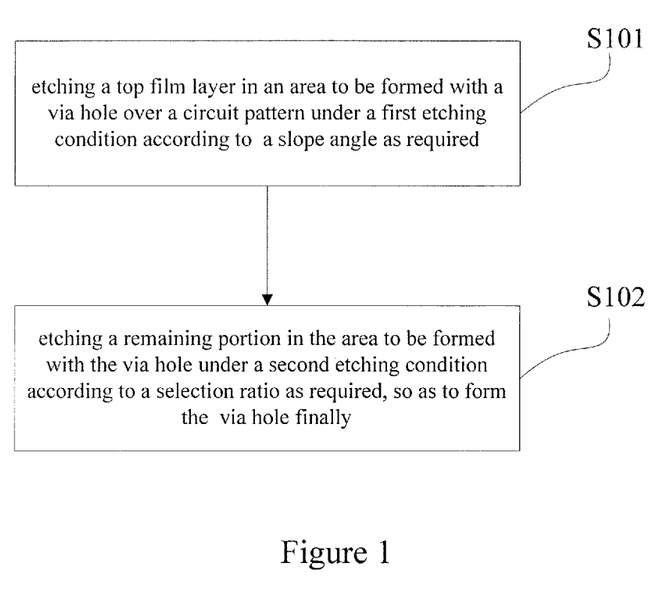
FIG. 1 is a flow chart illustrating a manufacture method of a via hole as provided an embodiment of the present invention.

The first embodiment of the present invention provides a manufacture method of via hole for display panel. As shown in FIG. 1, it comprises steps as below.

S101, a top film layer in an area to be formed with a via hole over a circuit pattern is etched under a first etching condition according to a slope angle as required such that a portion being etched under the first etching condition is formed with a preset slope angle.

S102, a remaining portion in the area to be formed with a via hole subjected the etching in S101 is etched under a second etching condition according to a selection ratio as required, so as to form the via hole finally; wherein the selection ratio is a ratio between etching rates in different film layers; and the portion etched under the second etching condition and the portion etched under the first etching condition are formed with different slope angles.

For example, in step 101 of the present embodiment, by selecting an etching condition according to a slope angle, it can form a slope angle as required, which allows the portion that is etched under the first etching condition to be formed with a preset slope angle. For example, if it is required to form a smaller via hole by etching, the first etching condition for forming a larger slope angle may be selected. In step 102, to avoid an excessively smaller selection ratio resulted by different etching rates in remaining film layers due to a selection of the first etching condition for forming a larger slope angle, the etching condition in the second step may be changed i.e., etching the remaining portion through utilizing the second etching condition which is selected according to a selection ratio as required. In this way, it can select etching condition according to an etching rate for a film layer to be etched practically. The etching condition may be selected such that a portion to be etched has a higher etching rate while a portion required no etching has a lower etching rate, so as to form the via hole as required finally. This not only can control an etching depth within an acceptable range, but improve the etching rate at the portion to be etched and hence increases the product yield. Since the first etching condition is different from the second etching condition, the portion that is etched under the first etching condition and the portion that is etched under the second etching condition in the via hole as formed have different slope angles.

A RIE (Reactive-Ion Etching) method involves both physical etching and chemical etching, wherein the physical etching emphasizes a vertical etching which results in a larger slope angle but usually a relatively lower selection ratio, while the chemical etching emphasizes a lateral etching which results in a relatively higher selection ratio. In a design of narrow bezel, it usually needs a larger slope angle and a higher selection ratio, and a smaller via hole is formed.

In S101 of embodiments of the present invention, when the etching under the first etching condition is conducted according to a slop angle, it can adopt a RIE method primarily using physical etching so as to etch the top film layer in the area to be formed with the via hole over the circuit pattern. While in S102, when the etching under the second etching condition is conducted according to a selection ratio as required, it can adopt the RIE method primarily using chemical etching so as to etch the remaining portion in the area to be formed with the via hole.

For example, in embodiments of the present invention, when it adopts the RIE method primarily using physical etching so as to etch the film layer located at the top on the circuit pattern corresponding to the area to be formed with the via hole, the etching process may be a complete etching such that the via hole to be formed has a uniform slope angle in the top film layer, or the etching process may be a partial etching such that the via hole to be formed has two different slop angles in the top film layer.

In S101 of embodiments of the present invention, the top film layer in the area to be formed with the via hole over the circuit pattern is etched under the first etching condition. To avoid further etching the circuit pattern beneath the top film layer after finishing the etching of the top film layer, for example, it can conduct a partial etching to the top film layer in the area to be formed with a via hole over the circuit pattern. By partly etching the top film layer, it can prevent the circuit pattern beneath the top film layer from being etched, so that an etching depth of the circuit pattern beneath the top film layer when subsequently conducting an etching under a second etching condition can be reduced as far as possible, thus preventing the lines from broken.

In the manufacture method of a via hole for a display panel as provided by the first embodiment, the via hole is formed by a two-step etching process in which the etching conditions are selected according to the slope angle and the selection ratio, respectively, so as to form the via hole as required finally and avoid the problem in the one-step etching process that the slop angle and the selection ratio cannot be arranged flexibly. Furthermore, the etching conditions can be selected flexibly according to actual demands, the manufacture process is simplified, and the product quantity is improved.

Second Embodiment

Figure 2:
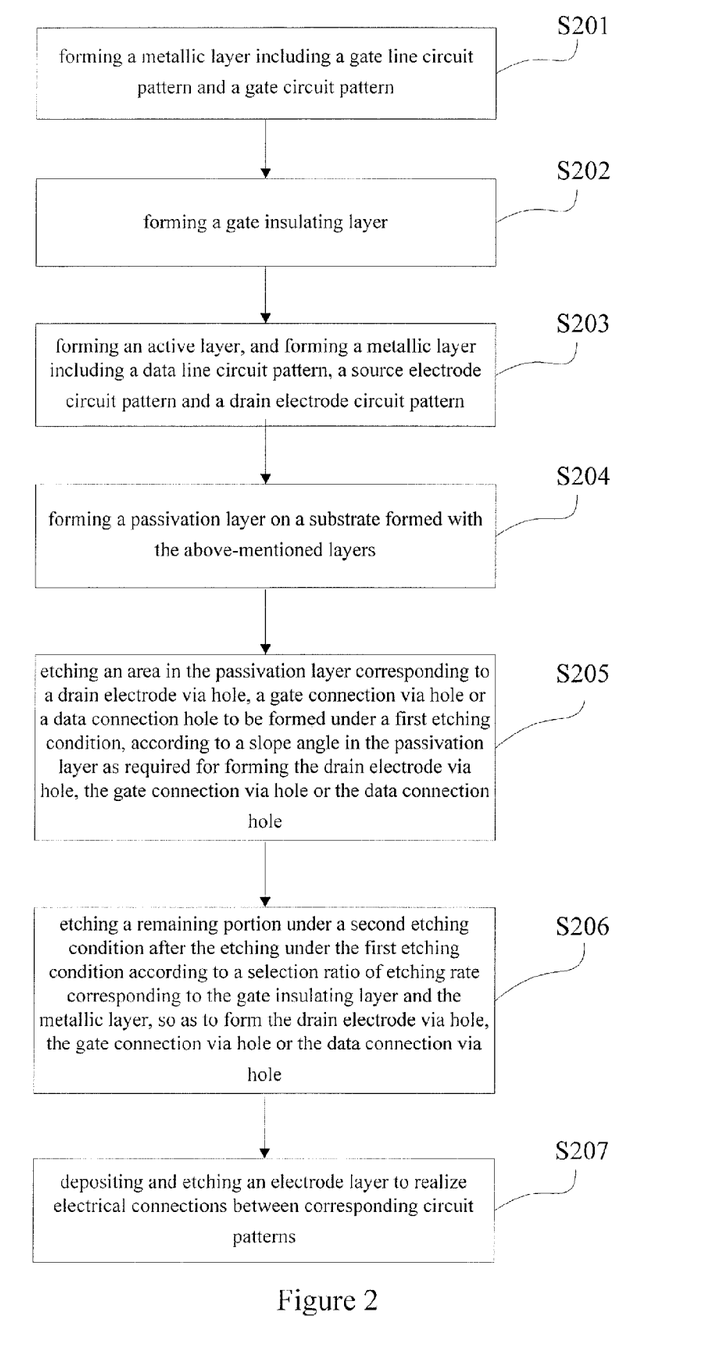
FIG. 2 is a flow chart illustrating a manufacture method of a display panel as provided by an embodiment of the present invention.

The second embodiment of the present invention provides a manufacture method of a display panel. As shown in FIG. 2, it comprises steps as below.

S201, a metallic layer including a gate line circuit pattern and a gate circuit pattern is formed.

For example, in embodiments of the present invention, a metallic layer including a gate line circuit pattern and a gate circuit pattern is formed on a substrate, which may be a substrate based on an inorganic material, such as a glass substrate and a quartz substrate, or may be a substrate adopting an organic material. The gate line and the gate are usually made from a same material and made in a same layer. They may be made from a lightproof conductive material, such as a metal material.

In embodiments of the present invention, it can form a lightproof conductive material on the substrate and then form the gate line circuit pattern and the gate circuit pattern by utilizing the same patterning process.

Figure 3A:
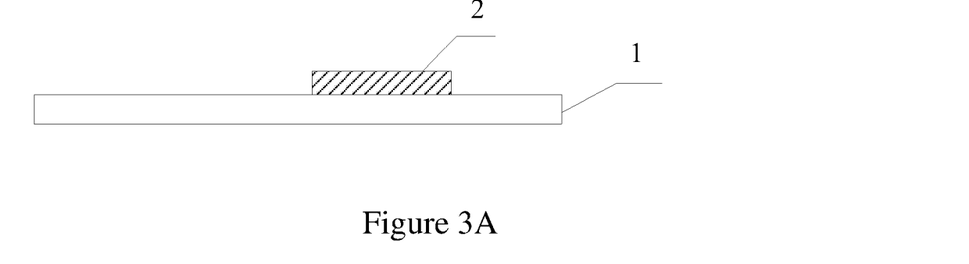
FIG. 3A-FIG. 3F are schematic views illustrating a manufacture process of a display panel as provided by embodiments of the present invention.

FIG. 3A is a schematic sectional view of a substrate 1 formed with a gate 2 thereon.

S202, a gate insulating layer is formed.

For example, in embodiments of the present invention, it can adopt a Plasma Enhanced Chemical Vapor Deposition (PECVD) method to form the gate insulating layer. However, the present invention is not limited thereto, and various other methods, such as coating and sputtering, are also applicable.

Figure 3B:
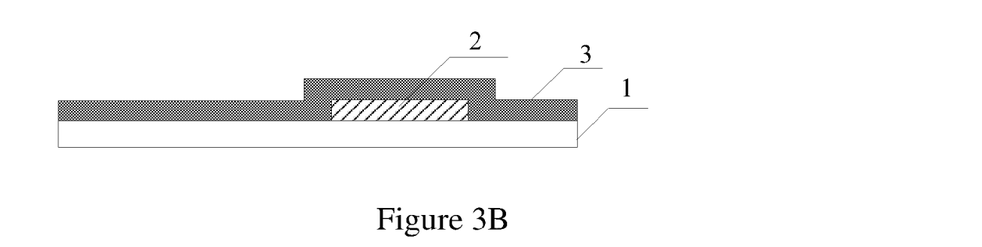

As shown in FIG. 3B, by the above-mentioned step S202, the gate insulating layer 3 is formed on the substrate having been formed with the gate 2.

S203, an active layer is formed, and a metallic layer including a data line circuit pattern, a source electrode circuit pattern and a drain electrode circuit pattern are formed.

Figure 3C:
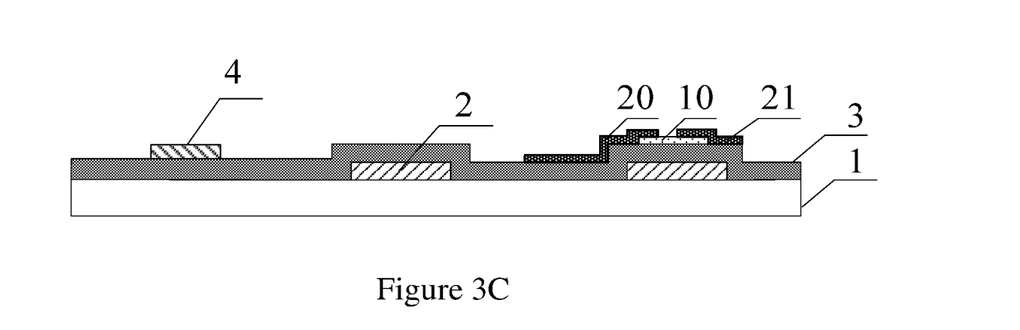
Figure 4A:
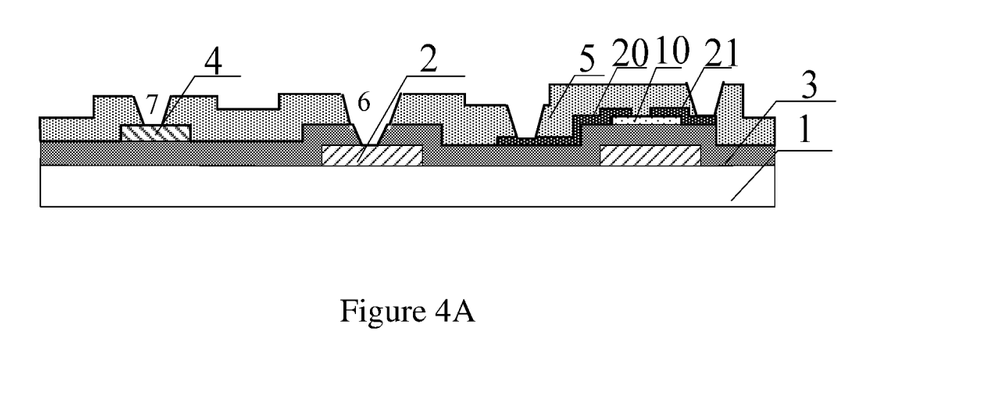
FIG. 4A-FIG. 4B are schematic views illustrating a structure of a display panel as provided by embodiments of the present invention.
Figure 4B:
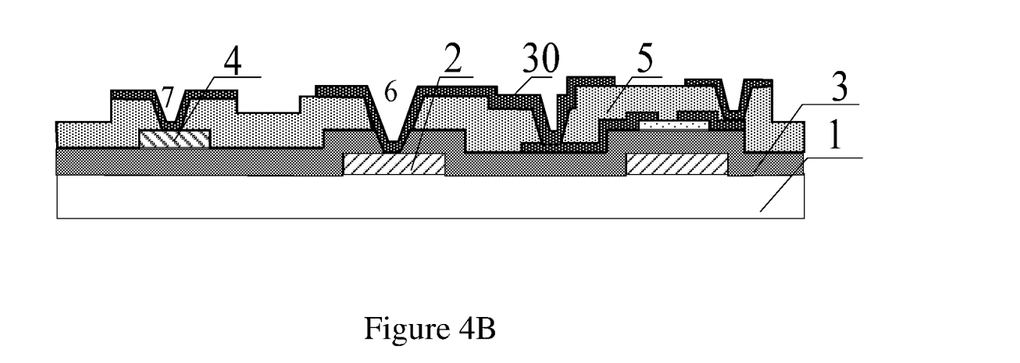

For example, the active layer 10 can comprise a semiconductor layer and a doped semiconductor layer, and a semiconductor layer between the source electrode 20 and the drain electrode 21 is configured to form a channel region of a thin film transistor (TFT), as shown in FIGS. 3C and 4A-4B.

In embodiments of the present invention, the active layer 10 can be formed by utilizing PECVD and the metallic layer is formed by utilizing magnetron sputtering, then a patterning process is conducted by using a duotone mask, for example, so as to form the data line circuit pattern located at a pixel region and a connection region, and the active layer circuit pattern, the source electrode circuit pattern and the drain electrode circuit pattern in the pixel region are formed. Embodiments of the present invention can adopt other methods to form the active layer and the metallic layer, and the present invention is not limited thereto.

As shown in FIG. 3C, a pattern 4 is formed from a SD metallic layer on the gate insulating layer 3 by the above-mentioned step S203 based on FIG. 3B.

S204, a passivation layer is formed.

For example, in embodiments of the present invention, the passivation layer can be formed by various methods, such as PECVD, and can be made by using materials, such as silicon nitride, but the present invention is not limited thereto.

Figure 3D:
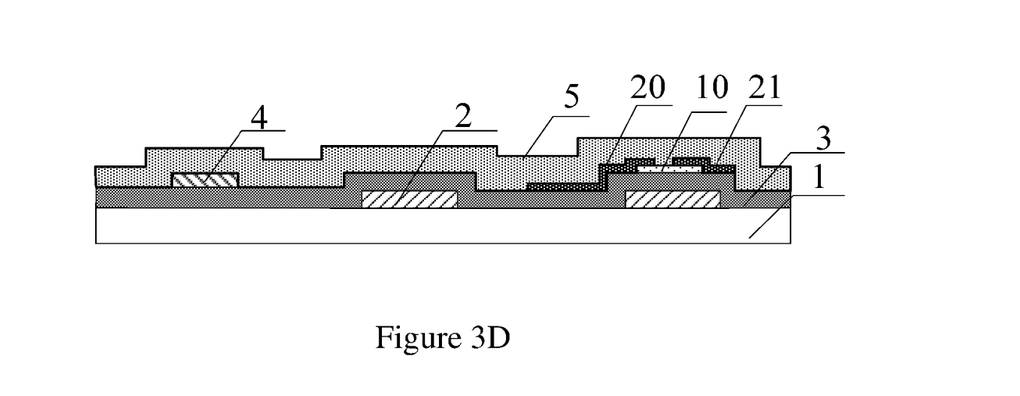

For example, in embodiments of the present invention, the gate insulating layer is formed between the metallic layer including the gate line circuit pattern and the gate circuit pattern and the active layer as well as the metallic layer including the data line circuit pattern, the source electrode circuit pattern and the drain electrode circuit pattern. As shown in FIG. 3D, a passivation layer 5 is formed by step S204 based on FIG. 3C.

S205, an area in the passivation layer is etched corresponding to a drain electrode via hole, a gate connection via hole or a data connection hole to be formed under a first etching condition, according to a slope angle in the passivation layer as required for forming the drain electrode via hole, the gate connection via hole or the data connection hole.

For example, in embodiments of the present invention, when etching the area in the passivation layer 5 corresponding to the drain electrode via hole, the gate connection via hole or the data connection hole to be formed under the first etching condition, it can adopt the RIE method primarily using physical etching to etch the passivation layer.

For example, the etching of the passivation layer 5 may be a complete etching such that the via hole formed has a uniform slope angle in the passivation layer. The etching of the passivation layer 5 may also be a partial etching such that the via hole formed has two different slop angles in the passivation layer 5, as shown in FIGS. 3D and 4A-4B. In embodiments of the present invention, it can adopt the RIE method primarily using physical etching to partly etch the passivation layer, so as to reduce the etching depth of the circuit pattern beneath the top film layer as far as possible, thereby preventing the lines from broken.

Figure 3E:
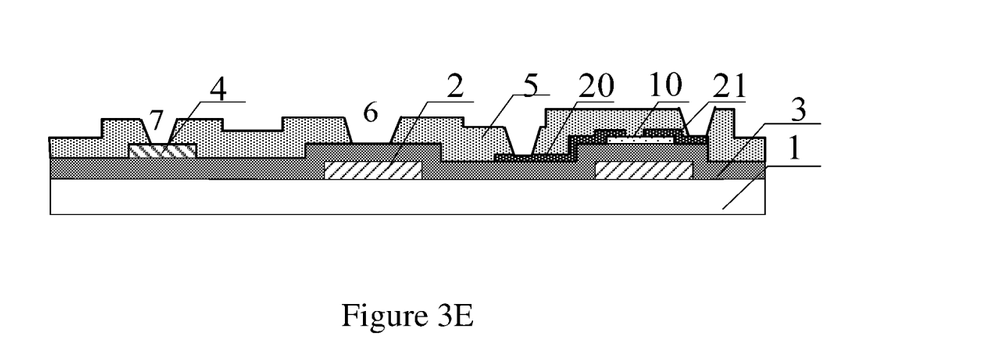

FIG. 3E is a schematic sectional view of a display panel in which the passivation layer 5 as shown in FIG. 3D has been partly etched.

S206, a remaining portion is etched under a second etching condition after the etching under the first etching condition, according to a selection ratio of etching rate corresponding to the gate insulating layer and the metallic layer including a data line circuit pattern, a source electrode circuit pattern and a drain electrode circuit pattern, so as to form the drain electrode via hole, the gate connection via hole and the data connection via hole.

Figure 3F:
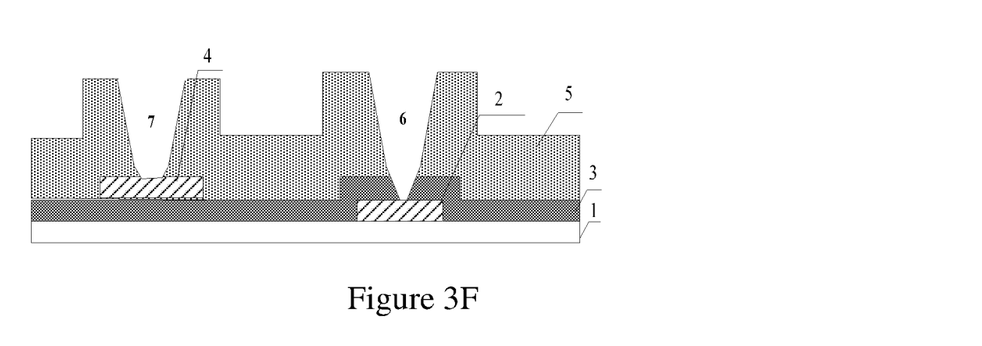

For example, in embodiments of the present invention, the selection ratio of etching rate according to the gate insulating layer and the metallic layer is such that the larger the selection ratio is, the quicker the gate insulating layer is etched, while the slower the metallic layer is etched. Therefore, in embodiments of the present invention, a RIE method primarily using chemical etching is used to etch the remaining passivation layer and gate insulating layer over the circuit pattern corresponding to the area to be formed with the via hole, so as to form the via hole as required finally, as shown in FIG. 3F.

S207, an electrode layer 30 is deposited and etched to realize electrical connections between corresponding circuit patterns, as shown in FIG. 4B.

The manufacture method of a display panel as provided by embodiments of the present invention conducts a two-step etching when forming the via hole on the metallic layer and forming the gate connection via hole. In a first step, a slope angle is formed under a first etching condition, and in a second step, the etching condition is adjusted. By forming the via hole as required finally under the second etching condition related to a selection ratio, the via hole as formed is relatively smaller, which is adapted to the tendency of products with narrow bezel and the product yield is increased.

Although the previous embodiments are described by referring to a display panel comprising a bottom-gate TFT, the present invention is not limited thereto. Instead, the present invention is also applicable to a display panel comprising a top-gate TFT. When it is applied in a display panel comprising a top-gate TFT, a source electrode and a drain electrode are formed before a gate electrode is formed in the manufacture of this display panel. Under such circumstance, it needs to adjust the steps of forming the source electrode, the drain electrode and the gate electrode adaptively, and needs to select the second etching condition correspondingly according to a selection ratio of etching rate corresponding to the gate insulating layer and the metallic layer including a gate line circuit pattern and a gate circuit pattern. Those skilled in the art can apply the manufacture method of a via hole according to the present invention upon adjusting the step of forming the top-gate TFT.

Third Embodiment

By applying the method in the first or the second embodiment, a third embodiment of the present invention provides a display panel comprising a circuit pattern layer, a film layer located over the circuit pattern layer, and a via hole formed in the film layer located over the circuit pattern layer by utilizing the manufacture method of the first embodiment for conducting circuit patterns.

In an example, the display panel as provided by embodiments of the present invention comprises a circuit pattern and an insulating layer formed on a substrate. The circuit pattern comprises at least a first circuit pattern and a second circuit pattern which are formed in different layer levels. The insulating layer comprises at least a first insulating layer and a second insulating layer which are formed on the substrate in sequence. The first circuit pattern is formed beneath the first insulating layer, while the second circuit pattern is formed on the first insulating layer and beneath the second insulating layer. The display panel further comprises a first via hole 6 and a second via hole 7 which are made by utilizing the manufacture method of a via hole in the first embodiment, and the first via hole 6 and the second via hole 7 are made under a first etching condition according to a slope angle as required and under a second etching condition according to a selection ratio as required in different steps, respectively.

The first via hole 6 is located over the first circuit pattern, penetrating the first insulating layer and the second insulating layer.

The second via hole 7 is located over the second circuit pattern, penetrating the second insulating layer.

A portion of the first via hole 6 that is located in the second insulating layer, and a portion of the second via hole 7 that has a same hole depth in the second insulating layer after an etching under the first etching condition, have a same slope angle; and, for the first via hole and the second via hole, a remaining portion after the etching under the second etching condition and a portion that is etched under the first etching condition have different slope angles.

For example, by applying the manufacture method of a via hole in the first embodiment, when a complete etching is conducted to the top film layer (i.e., the second insulating layer in embodiments of the present invention), it allows the second via hole 7 to have a uniform slope angle, and allows a portion of the first via hole 6 that is located in the second insulating layer and a portion of the second via hole 7 that has a same hole depth in the second insulating layer to have a same slope angle. Therefore the portion of the first via hole 6 that is located in the second insulating layer also has a uniform slope angle, while the portion of the first via hole 6 that is located in the first insulating layer and the portion of the first via hole 6 that is located in the second insulating layer have different slope angles, as shown in FIG. 4A.

By applying the manufacture method of a via hole in the first embodiment, when a partial etching is conducted to the top film layer (i.e., the second insulating layer in embodiments of the present invention), it allows the second via hole 7 to have two different slope angles, and allows a portion of the first via hole 6 that is located in the second insulating layer and a portion of the second via hole 7 that has a same hole depth in the second insulating layer to have a same slope angle. The portion of the first via hole 6 that is located in the second insulating layer also has different slope angles, while the portion of the first via hole 6 that is located in the first insulating layer and the portion of the first via hole 6 that is located at the bottom of the second insulating layer have a same slope angle, as shown in FIG. 4B.

The hierarchical structure of the display panel as provided by embodiments of the present invention is not limited to the previously described ones. Instead, for different hierarchical structures, the via holes as formed may have different hole depths. For example, it may be an array substrate having a drain electrode via hole, a gate connection via hole and a data connection via hole, but embodiments of the present invention are not limited thereto.

In the display panel as provided by embodiments of the present invention, a portion of the first via hole 6 that is located in the second insulating layer and a portion of the second via hole 7 that has a same hole depth in the second insulating layer have a same slope angle, and, for the first via hole 6 and the second via hole 7, the portion that is etched under the second etching condition and the portion that is etched under the first etching condition have different slope angles. Therefore, the via hole as formed has a smaller diameter. Moreover, it can realize electrical connections between circuit patterns in different film layers, which is adapted to the tendency of products with a narrow bezel and to improve the product yield.

With the manufacture method of a via hole, the manufacture method of a display panel, and the display panel as provided by the invention, the via hole is formed by a two-step etching process in which the etching conditions are selected according to the slope angle and the selection ratio, respectively, so as to form the via hole as required finally and can avoid the problem in a one-step etching process that the slop angle and the selection ratio cannot be set flexibly, and the etching conditions can be selected flexibly. The manufacture process is simplified and the product quality is improved.

It is understood that the described above are just exemplary implementations and embodiments to explain the principle of the present invention and the invention is not intended to limit thereto. An ordinary skill in the art can make various variations and modifications to the present invention without departure from the spirit and the scope of the present invention, and such variations and modifications shall fall in the scope of the present invention.

What is claimed is:

1. A method of manufacturing a via hole, comprising:
partially etching a passivation layer in an area to be formed with a via hole over a circuit pattern under a first etching condition according to a first slope angle as required by utilizing a reactive-ion etching (RIE) method primarily using an anisotropic physical etching, such that a portion that is etched under the first etching condition is formed with a preset slope angle; and
etching a remaining portion of the passivation layer and a portion of the gate insulation layer after the partial etching, in the area to be formed with the via hole under a second etching condition according to a second slope angle and a selection ratio as required by utilizing a RIE method primarily using an isotropic chemical etching, so as to form the via hole finally;
wherein the first slope angle is different from the second slope angle wherein the selection ratio is a ratio between a gate insulating layer etching rate to a metallic layer etching rate, the metallic layer includes a data line circuit pattern, a source electrode circuit pattern and a drain electrode circuit pattern; and the metallic layer is formed on the gate insulating layer, and the passivation layer is formed on the metallic layer.

2. A manufacture method of a display panel, comprising:
forming a first metallic layer including a gate line circuit pattern and a gate circuit pattern;
forming a gate insulating layer;
forming an active layer;
forming a second metallic layer including a data line circuit pattern, a source electrode circuit pattern and a drain electrode circuit pattern; and
forming a passivation layer on a substrate formed with the above-mentioned layers; wherein the gate insulating layer is formed between the first metallic layer and the active layer as well as the second metallic layer;
partially etching an area in the passivation layer corresponding to a drain electrode via hole, a gate connection via hole or a data connection hole to be formed under a first etching condition according to a first slope angle in the passivation layer as required for forming the drain electrode via hole, the gate connection via hole or the data connection hole by utilizing a reactive-ion etching (RIE) method primarily using an anisotropic physical etching;
etching a remaining portion of the passivation layer and a portion of the gate insulation layer after the partial etching corresponding to the drain electrode via hole, the gate connection via hole, or the data connection hole to be formed under a second etching condition according to a second slope angle after the partially etching under the first etching condition, according to a selection ratio of etching rate corresponding to the gate insulating layer and the second metallic layer, or according to a selection ratio of etching rate corresponding to the gate insulating layer and the first metallic layer by utilizing a RIE method primarily using an isotropic chemical etching, so as to form the drain electrode via hole, the gate connection via hole and the data connection via hole, wherein the first slope angle is different from the second slope angle; and
forming electrical connections between the circuit patterns.

* * * * *